US006208164B1

(12) United States Patent
Noble et al.

(10) Patent No.: US 6,208,164 B1
(45) Date of Patent: Mar. 27, 2001

(54) PROGRAMMABLE LOGIC ARRAY WITH VERTICAL TRANSISTORS

(75) Inventors: Wendell P. Noble, Milton, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/129,047

(22) Filed: Aug. 4, 1998

(51) Int. Cl.$^7$ .............................................. H03K 19/177
(52) U.S. Cl. ............................................. 326/41; 326/102
(58) Field of Search .................................. 257/302, 202, 257/330, 320; 326/39, 41, 44, 101, 102

(56) References Cited

U.S. PATENT DOCUMENTS

| | | | |
|---|---|---|---|
| 4,020,364 | 4/1977 | Kuijk ................................... | 307/242 |
| 4,051,354 | 9/1977 | Choate ................................ | 235/312 |
| 4,313,106 | 1/1982 | Hsu ................................ | 340/825.91 |
| 4,604,162 | 8/1986 | Sobczak ............................. | 156/657 |
| 4,617,649 | * 10/1986 | Kyomasu et al. ................... | 326/41 |
| 4,663,831 | 5/1987 | Birrittella et al. .................. | 29/576 E |
| 4,673,962 | 6/1987 | Chatterjee et al. ................. | 357/23.6 |
| 4,716,314 | * 12/1987 | Mulder et al. ....................... | 326/101 |
| 4,761,768 | 8/1988 | Turner et al. ........................ | 365/201 |
| 4,766,569 | 8/1988 | Turner et al. ........................ | 365/185 |
| 4,845,537 | * 7/1989 | Nishimura et al. .................. | 257/330 |
| 4,888,735 | 12/1989 | Lee et al. ............................. | 365/185 |
| 4,920,065 | 4/1990 | Chin et al. ............................ | 437/52 |
| 4,920,515 | 4/1990 | Obata ............................. | 365/189.08 |
| 4,958,318 | 9/1990 | Harari ................................ | 365/149 |
| 4,965,651 | * 10/1990 | Wagner ................................ | 257/330 |
| 4,987,089 | 1/1991 | Roberts .................................. | 437/34 |

(List continued on next page.)

FOREIGN PATENT DOCUMENTS 63-066963   3/1988   (JP) ............................... H01L/27/10

OTHER PUBLICATIONS

Adler, E., et al., "The Evolution of IBM CMOX DRAM Technology", *IBM J. Res. Develop.*, 39(1/2), 167–188, (1995).

Asai, S., et al., "Technology Challenges for Integration Near and Below 0.1 micrometer", *Proceedings of the IEEE*, Special Issue on Nanometer–Scale Science & Technology, 505–520, (Apr. 1997).

Banerjee, S.K., et al., "Characterization of Trench Transistors for 3–D Memories", *1986 Symposium on VLSI Technology, Digest of Technical Papers*, San Diego, CA, 79–80, (May 1986).

Blalock, T.N. et al., "A High–Speed Sensing Scheme for IT Dynamic RAM's Utilizing the Clamped Bit–Line Sense Amplifier", *IEEE Journal of Solid–State Circuits*, 27 (4), pp. 618–624, (Apr. 1992).

Bomchil, G., et al., "Prous Silicon: The Material and its Applications In Silicon–On–Insulator Technologies", *Applied Surface Science*, 41/42, 604–613 (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 1994).

(List continued on next page.)

*Primary Examiner*—Michael Tokar
*Assistant Examiner*—Don Phu Le
(74) *Attorney, Agent, or Firm*—Schwegman, Lundberg, Woessner & Kluth, P.A.

(57) ABSTRACT

A programmable logic array is provided. The programmable logic array includes first and second logic planes. The first logic plane receives a number of input signals. The first logic plane includes a plurality of vertical transistors arranged in rows and columns that are interconnected to provide a number of logical outputs. The second logic plane also includes a number of vertical transistors arranged in rows and columns that receive the outputs of the first logic plane and that are interconnected to produce a number of logical outputs such that the programmable logic array implements a logical function.

30 Claims, 12 Drawing Sheets

U.S. PATENT DOCUMENTS

| | | | | |
|---|---|---|---|---|
| 5,001,526 | | 3/1991 | Gotou | 357/23.6 |
| 5,006,909 | | 4/1991 | Kosa | 357/23.6 |
| 5,017,504 | | 5/1991 | Nishimura et al. | 437/40 |
| 5,021,355 | | 6/1991 | Dhong et al. | 437/35 |
| 5,028,977 | | 7/1991 | Kenneth et al. | 357/43 |
| 5,057,896 | | 10/1991 | Gotou | 357/49 |
| 5,072,269 | | 12/1991 | Hieda | 357/23.6 |
| 5,083,047 | * | 1/1992 | Horie et al. | 326/41 |
| 5,102,817 | | 4/1992 | Chatterjee et al. | 437/47 |
| 5,110,752 | | 5/1992 | Lu | 437/47 |
| 5,156,987 | | 10/1992 | Sandhu et al. | 437/40 |
| 5,177,028 | | 1/1993 | Manning | 437/41 |
| 5,177,576 | | 1/1993 | Kimura et al. | 257/71 |
| 5,202,278 | | 4/1993 | Mathews et al. | 437/47 |
| 5,208,657 | | 5/1993 | Chatterjee et al. | 257/302 |
| 5,216,266 | | 6/1993 | Ozaki | 257/302 |
| 5,221,867 | * | 6/1993 | Mitra et al. | 326/41 |
| 5,223,081 | | 6/1993 | Doan | 156/628 |
| 5,266,514 | | 11/1993 | Tuan et al. | 437/52 |
| 5,316,962 | | 5/1994 | Matsuo et al. | 437/52 |
| 5,320,880 | | 6/1994 | Sandhu et al. | 427/578 |
| 5,327,380 | | 7/1994 | Kersh, III et al. | 365/195 |
| 5,376,575 | | 12/1994 | Kim et al. | 437/52 |
| 5,391,911 | | 2/1995 | Beyer et al. | 257/522 |
| 5,392,245 | | 2/1995 | Manning | 365/200 |
| 5,393,704 | | 2/1995 | Huang et al. | 437/203 |
| 5,396,093 | | 3/1995 | Lu | 257/306 |
| 5,410,169 | | 4/1995 | Yamamoto et al. | 257/301 |
| 5,414,287 | | 5/1995 | Hong | 257/316 |
| 5,416,350 | | 5/1995 | Watanabe | 257/330 |
| 5,422,499 | | 6/1995 | Manning | 257/67 |
| 5,427,972 | | 6/1995 | Shimizu et al. | 437/52 |
| 5,432,739 | | 7/1995 | Pein | 365/185 |
| 5,438,009 | | 8/1995 | Yang et al. | 437/52 |
| 5,440,158 | | 8/1995 | Sung-Mu | 257/314 |
| 5,445,986 | | 8/1995 | Hirota | 437/60 |
| 5,460,316 | | 10/1995 | Hefele | 228/39 |
| 5,460,988 | | 10/1995 | Hong | 437/43 |
| 5,466,625 | | 11/1995 | Hsieh et al. | 437/52 |
| 5,483,094 | | 1/1996 | Sharma et al. | 257/316 |
| 5,483,487 | | 1/1996 | Sung-Mu | 365/185.33 |
| 5,492,853 | | 2/1996 | Jeng et al. | 437/60 |
| 5,495,441 | | 2/1996 | Hong | 365/185.01 |
| 5,497,017 | | 3/1996 | Gonzales | 257/306 |
| 5,504,357 | | 4/1996 | Kim et al. | 257/306 |
| 5,508,219 | | 4/1996 | Bronner et al. | 437/52 |
| 5,508,542 | | 4/1996 | Geiss et al. | 257/301 |
| 5,519,236 | | 5/1996 | Ozaki | 257/302 |
| 5,528,062 | | 6/1996 | Hsieh et al. | 257/298 |
| 5,563,083 | | 10/1996 | Pein | 437/43 |
| 5,574,299 | | 11/1996 | Kim | 257/296 |
| 5,593,912 | | 1/1997 | Rajeevakumar | 437/52 |
| 5,616,934 | | 4/1997 | Dennison et al. | 257/67 |
| 5,637,898 | * | 6/1997 | Baliga | 257/329 |
| 5,640,342 | | 6/1997 | Gonzalez | 365/156 |
| 5,644,540 | | 7/1997 | Manning | 365/200 |
| 5,646,900 | | 7/1997 | Tsukude et al. | 365/205 |
| 5,691,230 | | 11/1997 | Forbes | 437/62 |
| 5,705,415 | | 1/1998 | Orlowski et al. | 437/43 |
| 5,818,084 | * | 10/1998 | Williams et al. | 257/329 |
| 5,821,578 | | 10/1998 | Shimoji | 257/295 |
| 5,907,170 | | 5/1999 | Forbes et al. | 257/296 |
| 5,909,618 | | 6/1999 | Forbes et al. | 438/242 |
| 5,914,511 | | 6/1999 | Noble et al. | 257/302 |
| 5,920,088 | * | 7/1999 | Augusto | 257/192 |

OTHER PUBLICATIONS

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M.J., et al., "Back–Gate Forward Bias Method for Low Voltage CMOS Digital Cicuits", *IEEE Transactions on Electron Devices*, 43, 904–909, (Jun. 1996).

Chen, M.J. et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Application", *Proceedings of the 1996 IEEE International SOI Conference*, Sanibel Island, FL, 20–21, (1996).

De, V.K., et al., "Random MOSFET Parameter Fluctuation Limits to Gigascale Integration(GSI)", *1996 Symposium on VLSI Technology, Digest of Technical Papers*, Honolulu, HI, 198–199, (Jun. 11–13, 1996).

Denton, J.P., et al., "Fully Depleted Dual–Gated Thin–Film SOI P–MOSTET's Fabricated in SOI Islands with an Isolated Buried Polysilicon Backgate", *IEEE Electron Device Letters*, 17 (11), 509–511, (Nov. 1996).

Fong, Y., et al., "Oxides Grown on Textured Single–Crystal Silicon—Dependence on Process and Application in EEPROMs", *IEEE Transactions on Electron Devices*, 37 (3), pp. 583–590, (Mar. 1990).

Forbes, L., et al., "Resonant Forward–Biased Guard–Ring Diodes for Suppression of Substrate Noise in Mixed–Mode CMOS Circuits", *Electronics Letters*, 31, 720–721, (Apr. 1995).

Foster, R., et al., "High Rate Low–Temperature Selective Tungsten", In: *Tungsten and Other Refractory Metals for VLSI Applications III*, V.A. Wells, ed., Materials Res. Soc., Pittsburgh, PA, 69–72, (1988).

Fuse, T., et al., "A 0.5V 200MHz 1–Stage 32b ALU Using a Body Bias Controlled SOI Pass–Gate Logic", *1997 IEEE International Solid–State Circuits Conference Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, Austin, TX, 21–24, (1995).

Hao, M.Y. et al., "Electrical Characteristics of Oxynitrides Grown on Textured Single–Crystal Silicon", *Appl. Phys. Lett.* 60, 445–447, (Jan. 1992).

Harad, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Heavens, O., *Opitcal Properties of Thin Solid Films*, Dover Pubs. Inc., New York, 155–206, (1965).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits, 2nd Edition*, Section: 9.1.3, 354–357, (1988).

Holman, W.T., et al., "A Compact Low Noise Operational Amplifier for a 1.2 Micrometer Digital CMOS Technology", *IEEE Journal of Solid–State Circuits*, 30, 710–714. (June 1995).

Hu, G., et al., "Will Flash Memory Replace Hard Disk Drive?", *1994 IEEE International Electron Device Meeting*, Panel Discussion, Session 24, Outline, 2 pp., (Dec. 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits*, 31, 1575–1583, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", *In: Advanced Metallization and Interconnect Systems for ULSI Applications in 1995*, R.C. Ellwanger, et al., Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31 (4), pp. 586–591, (Apr. 1996).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *Journal of the Electrochemical Society*, 140 (10), 2836–2843, (Oct. 1993).

Lu, N., et al., "The SPT Cell —A New Substrate–Plate Trench Cell for DRAMS", *1985 IEEE International Electron Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Phi–Shape Transistor (VPhiT) Cell for a Gbit DRAM and beyond", *1994 Symposium of VLSI Technology, Digest of Technical Papers*, Honolulu, HI, 133–134, (Jun. 7–9, 1994).

Maeda, S., et al., "Impact of a Vertical Phi–Shape Transistor (VPhIT) Cell for a 1 Gbit DRAM and Beyond", *IEEE Transactions on Electron Devices*, 42, 2117–2123, (Dec. 1995).

Malaviya, S., *IBM TBD15*, p. 42, (Jul. 1972).

Masu, K., et al., "Multilevel Metallization Based on Al CVD", *1996 IEEE Symposium on VLSI Technology, Digest of Technical Papers*, 44–45, (Jun. 11–13, 1996).

McCredie, B.D., et al., "Modeling, Measurements, and Simulation of Simultaneous Switching Noise", *IEEE Transactions on Components, Packaging, and Manufacturing Technology —Part B*, 19, 461–472, (Aug. 1996).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohba, T., et al., "Evaluation on Selective Deposition of CVD W Films by Measurement of Surface Temperature", *In: Tugsten and Other Refractory Metals for VLSI Applications II*, Materials Research Society, Pittsburgh, PA. 59–66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA. 17–25 (1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (SIMPLE) Cell with Checkered Layout for 256Mbit DRAMS and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D PENCIL Flash EPROM Cell and Memory Array", *IEEE Transactions on Electron Devices*, 42, 1982–1991, (Nov. 1995).

Pein, H.B. et al., "Performance of the 3–D Sidewall Flash EPROM Cell", *IEEE International Electron Devices Meeting, Technical Digest*, 11–14, (1993).

Ramo, S., et a., *Fields and Waves in Communication Electronics, Third Edition*, John Wiley & Sons Inc., pp. 428–433, (1994).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Richardson, W.F., et al., "A Trench Transistor Cross–Point DRAM Cell", *IEEE International Electron Devices Meeting*, Washington, D.C. 714–717, (Dec. 1–4, 1985).

Sagara, K., et al., "A0.72 micro–meter2 Recessed STC (RSTC) Technology for 256Mbit DRAMS using Quarter–Micron Phase–Shift Lithography", *1992 Symposium on VLSI Technology, Digest of Technical Papers*, Seattle WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid State Circuits*m 26(4), pp. 525–536, (Apr. 1991).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, 1765–1773, (Sep. 1994).

Shah, A.H., et al., "A 4–Mbit DRAM with Trench–Transistor Cell", *IEEE Journal of Solid–State Circuits, SC–21*, (Oct. 1986).

Shah, A.H., et al., "A 4Mb DRAM with Cross–Point Trench Transistor Cell", *1986 IEEE International Solid–State Circuits Conference, Digest of Technical Papers*, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A IV 46ns 16Mb SOI–DRAM with Body Control Technique", *1997 IEEE International Solid–State Circuits Conference, Digest of Technical Papers*, 68–69, (Feb. 6, 1997).

Stanisic, B.R., et al., "Addressing Noise Decoupling in Mixed–Signal IC's: Power Distribution Design and Cell Customization", *IEEE Journal of Solid–State Circuits*, 30, 321–326, (Mar. 1995).

Stellwag, T.B., et al., "A Vertically–Integrated GaAs Bipolar DRAM Cell", *IEEE Transactions on Electron Devices*, 38, 2704–2705 (Dec. 1991).

Su, D.K. et al., "Eperimental Results and Modeling Techniques for Substrate Noise in Mixed–Signal Integrated Circuits", *IEEE Journal of Solid–State Circuits*, 28(4), 420–430, (Apr. 1993).

Suma, K., et al., "An SOI–DRAM with Wide Operating Voltage Range by CMOS/SIMOX Technology", *IEEE Journal of Solid–State Circuits*, 29 (11), pp. 1323–1329, (Nov. 1994).

Sun, J., "CMOS Technology for 1.8V and Beyond", *Int'l Symp. on VLSI Technology, Systems and Applications: Digest of Technical Papers*, 293–297 (1997).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, 562–565, (Nov. 7–10, 1994).

Takao, Y., et al., "A 4–um(2) Full–CMOS SRAM Cell Technology for 0.2–um High Performance Logic LSIs", *1997 Symp, on VLSI Technology: Digest of Technical Papers*, Kyoto, Japan, 11–12, (1997).

Takato, H., et al., "High Performance CMOS Surrounding Gate Transistor (SGT) for Ultra High DEnsity LSIs", *IEEE International Electron Devices Meeting, Technical Digest*, 222–225, (1988).

Takato, H., et al., "Impact of Surrounding Gate Transistor (SGT) for Ultra–High Density LSIs", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digiest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers* Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers*, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in MOSFET Structure", *IEEE Transactions on Electron Devices*38, 2487–2496, (Nov. 1991).

Vittal, A., et al., "Clock Skew Optimization for Ground Bounce Control", *1996 IEEE/ACM International Conference on Computer–Aided Design, Digest of Technical Papers*, San Jose, CA, 395–399, (Nov. 10–14, 1996).

Wang, N., *Digital MOS Intergrated Circuits*, Prentice Hall, Inc., Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemisperical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemispherical–Grained Si", *J., Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

* cited by examiner

PROGRAMMABLE LOGIC ARRAY WITH VERTICAL TRANSISTORS

TECHNICAL FIELD OF THE INVENTION

This invention relates generally to integrated circuits and in particular to a programmable logic array with vertical transistors.

BACKGROUND OF THE INVENTION

Logic circuits are an integral part of digital systems, such as computers. Essentially, a logic circuit processes a number of inputs to produce a number of outputs for use by the digital system. The inputs and outputs are generally electronic signals that take on one of two "binary" values, a "high" logic value or a "low" logic value. The logic circuit manipulates the inputs using binary logic which describes, in a mathematical way, a given or desired relationship between the inputs and the outputs of the logic circuit.

Logic circuits that are tailored to the specific needs of a particular customer can be very expensive to fabricate on a commercial basis. Thus, general purpose very large scale integration (VLSI) circuits are defined. VLSI circuits serve as many logic roles as possible, which helps to consolidate desired logic functions. However, random logic circuits are still required to tie the various elements of a digital system together.

Several schemes are used to implement these random logic circuits. One solution is standard logic, such as transistor-transistor logic (TTL). TTL integrated circuits are versatile because they integrate only a relatively small number of commonly used logic functions. The drawback is that large numbers of TTL integrated circuits are typically required for a specific application. This increases the consumption of power and board space, and drives up the overall cost of the digital system.

One alternative to standard logic is fully custom logic integrated circuits. Custom logic circuits are precisely tailored to the needs of a specific application. This allows the implementation of specific circuit architectures that dramatically reduces the number of parts required for a system. However, custom logic devices require significantly greater engineering time and effort, which increases the cost to develop these circuits and may also delay the production of the end system.

A less expensive alternative to custom logic is the "programmable logic array." Programmable logic arrays take advantage of the fact that complex combinational logic functions can be reduced and simplified into various standard forms. For example, logical functions can be manipulated and reduced down to traditional Sum of Products (SOP) form. In SOP form, a logical function uses just two types of logic functions that are implemented sequentially. This is referred to as two-level logic and can be implemented with various conventional logic functions, e.g., AND-OR, NAND-NAND, NOR-NOR.

One benefit of the programmable logic array is that it provides a regular, systematic approach to the design of random, combinational logic circuits. A multitude of logical functions can be created from a common building block, e.g., an array of transistors. The logic array is customized or "programmed" by creating a specific metallization pattern to interconnect the various transistors in the array to implement the desired function.

Programmable logic arrays are fabricated using photolithographic techniques that allow semiconductor and other materials to be manipulated to form integrated circuits as is known in the art. These photolithographic techniques essentially use light that is focused through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of thee photolithographic process. The minimum feature size imposes one constraint on the size of the components of a programmable logic array. In order to keep up with the demands for larger programmable logic arrays, designers search for ways to reduce the size of the components of the array.

For the reasons stated above, and for other reasons stated below which will become apparent to those skilled in the art upon reading and understanding the present specification, there is a need in the art for a programmable logic array that uses less surface area of a semiconductor wafer as compared to conventional arrays.

SUMMARY OF THE INVENTION

The above mentioned problems with programmable logic arrays and other problems are addressed by the present invention and will be understood by reading and studying the following specification. A programmable logic array is described which is formed with vertical transistors.

In one embodiment, a programmable logic array is provided. The programmable logic array includes first and second logic planes. The first logic plane receives a number of input signals. The first logic plane includes a plurality of vertical transistors arranged in rows and columns that are interconnected to provide a number of logical outputs. The second logic plane also includes a number of vertical transistors arranged in rows and columns that receive the outputs of the first logic plane and that are interconnected to produce a number of logical outputs such that the programmable logic array implements a logical function.

DETAILED DESCRIPTION OF THE INVENTION

Figure 1:
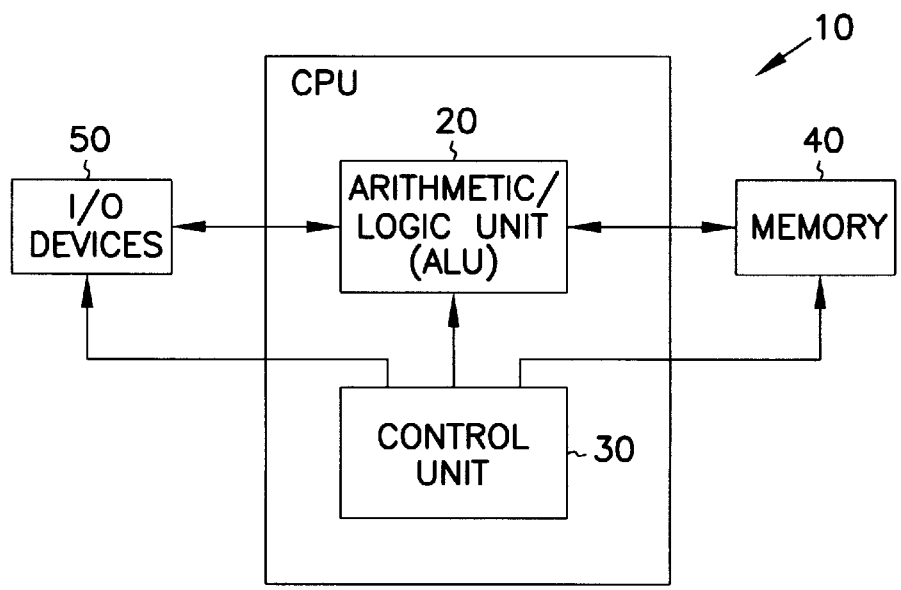
FIG. 1 is a simplified block diagram of a high-level organization of a digital computer including one or more programmable logic arrays formed with vertical transistors according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term "horizontal" as used in this application is defined as a plane parallel to the conventional plane or surface of a wafer or substrate, regardless of the orientation of the wafer or the substrate. The term "vertical" refers to a direction perpendicular to the horizontal as defined above. Prepositions, such as "on," "side," (as in sidewall), "higher," "lower," "over," and under are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

FIG. 1 is a simplified block diagram of a high-level organization of a digital computer 10. A digital computer 10 is a system whose functional elements consist of an arithmetic/logic unit (ALUs) 20, a control unit 30, a memory unit 40 and an input/output (I/O) device 50. Every computer system has a native set of instructions that specify operations to be performed on data by the ALU 20 and other interactions between the ALU 20, the memory unit 40 and the I/O devices 50. The memory units 40 contain the data plus a stored list of instructions.

The control unit 30 coordinates all operations of the ALU 20, the memory unit 40 and the I/O devices 50 by continuously cycling through a set of operations that cause instructions to be fetched from the memory unit 40 and executed. Many of the logic functions performed by these components can include a programmable logic array with vertical transistors according to the teachings of the present invention. With respect to the ALU 20, the control unit 30 and the I/O devices 50, arbitrary logic functions may be realized in the "sum-of-products" form. A logic function sum-of-products may be implemented using any of the equivalent two-level logic configurations: AND-OR, NAND-NAND, NOR-OR, OR-NOR, AND-NOR, NAND-AND or OR-AND.

Figure 2:
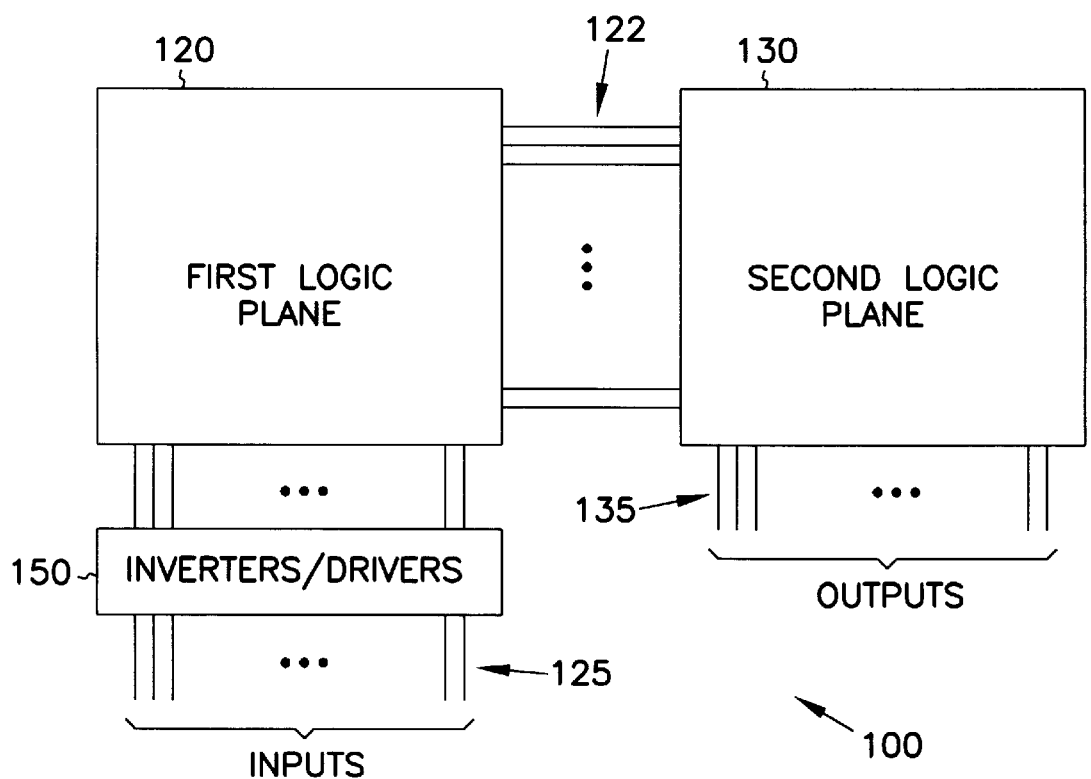
FIG. 2 is a simplified block diagram of an embodiment of a programmable logic array according to the teachings of the present invention.

FIG. 2 is a simplified diagram of a programmable logic array (PLA), indicated generally at 100, and constructed according to the teachings of the present invention. PLA 100 includes two major constituents: a first logic plane 120 and a second logic plane 130. The first and second logic planes 120 and 130 are formed using an array of vertical transistors. In one embodiment, the first and second logic planes 120 and 130 each comprise NOR logic circuits such that PLA 100 implements NOR-NOR logic. In other embodiments, first and second logic planes 120 and 130 are constructed from arrays of vertical transistors that are configured to implement AND-OR, OR-AND, NAND-NAND, NOR-OR, OR-NOR, AND-NOR, and NAND-AND logic.

Input lines 125 are coupled to receive a number of input signals. Inverters/drivers 150 are coupled to the input lines 125 such that first logic plane 120 is capable of receiving each of the input signals and their complements. First logic plane 120 produces a number of output signals that are logical combinations of the signals from inverters/drivers 150. The output signals from first logic plane 120 are provided to second logic plane 130 via interconnection lines 122. Second logic plane 130 produces a number of output signals that are logical combinations of the signals from interconnection lines 122.

In addition, various control circuits and signals not detailed herein initiate and synchronize the PLA 100 operation as known to those skilled in the art. The PLA 100 implementation described with respect to FIG. 2 is illustrative only and is not intended to be exclusive or limiting.

Figure 3:
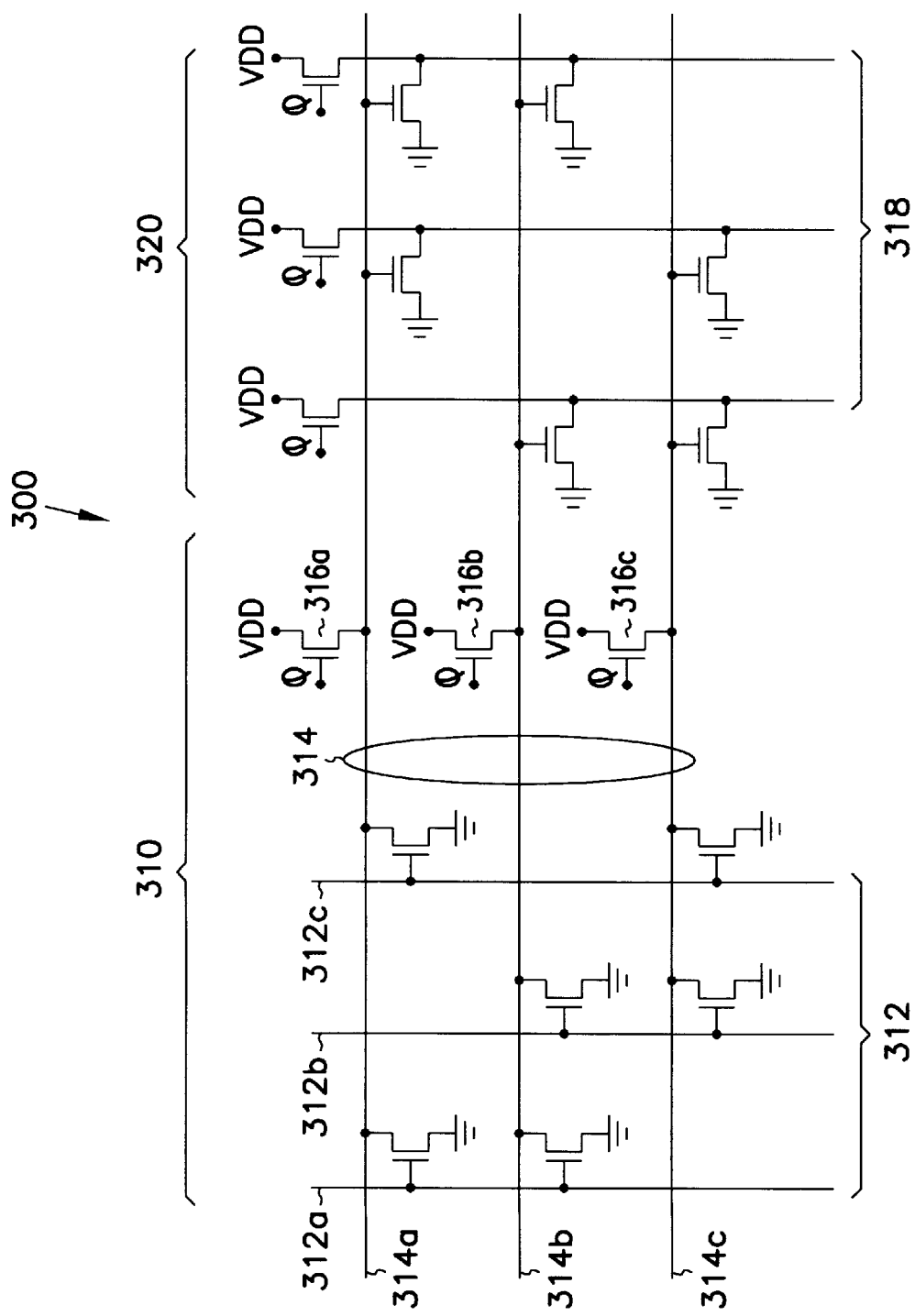
FIG. 3 is a schematic diagram of one embodiment of a programmable logic array according to the teachings of the present invention.

FIG. 3 is a schematic diagram illustrating generally an architecture of one embodiment of a programmable logic array (PLA), indicated generally at 300, and constructed according to the teachings of the present invention. PLA 300 implements an illustrative logical function using a two level logic approach. Specifically, PLA 300 includes first and second logic planes 310 and 320. In this example, the logic function is implemented using NOR-NOR logic. First and second logic planes 310 and 320 each include an array of vertical transistors that are configured to implement the logical function of PLA 300.

It is noted that the configuration of FIG. 3 is provided by way of example and not by way of limitation. Specifically, the teachings of the present application are not limited to programmable logic arrays in the NOR-NOR approach. Further, the teachings of the present application are not limited to the specific logical function shown in FIG. 3. Other logical functions can be implemented in a programmable logic array with vertical transistors using any one of the various two level logic approaches.

First logic plane 310 receives a number of input signals at input lines 312. In this example, no inverters are provided for generating complements of the input signals. However, first logic plane 310 can include inverters to produce the complementary signals when needed in a specific application.

First logic plane 310 includes a number of vertical transistors that form an array. The transistors are located at the intersection of input lines 312 and interconnect lines 314. Not all of the transistors are operatively connected in the first logic plane. Rather, the transistors are selectively coupled to the input and interconnection lines so as to implement a desired logic function. Thus, some transistors are left unconnected. This selective interconnection is referred to as "mask programming" since the logical function implemented by the programmable logic array is "programmed" into the array by masking steps that are used in the generation of the conductors that interconnect the transistors in the array.

In this embodiment, each of the interconnect lines 314 acts as a NOR gate for the input lines 312 that are connected to the interconnect lines 314 through the transistors of the array. For example, interconnection line 314a acts as a NOR gate for the signals on input lines 312b and 312c. That is, p-channel pull up transistor 316a maintains interconnect line 314a at a high potential unless one or more of the transistors that are coupled to interconnect line 314a are turned on by a high logic level signal on an input line.

In a similar manner, second logic plane 320 comprises a second array of transistors that are selectively interconnected to provide the second level of the two level logic needed to implement a specific logical function. In this embodiment, the array of transistors is also configured such that the output lines 318 comprise a logical NOR function of the signals from the interconnection lines 314 that are coupled to particular output lines through the vertical transistors of the second logic plane 320.

FIGS. 4 through 11 illustrate a number of embodiments for implementing a logic plane with vertical transistors for use in a programmable logic array. FIGS. 4 and 5, 6 and 7, 8 and 9, and 10 and 11 are top and side views, respectively, of the various embodiments. For purposes of clarity, only a portion of each logic plane is shown in each Figure.

Generally, the logic planes of the illustrated embodiments include a number of pillars of monocrystalline semiconductor material. These pillars form the basis for the vertical transistors of a logic plane. For example, logic plane 350a of FIGS. 4 and 5 includes pillars 352a, 354a, 356a, and 358a. The pillars are separated from adjacent pillars by a number of orthogonal trenches.

Each pillar includes at least three vertically aligned regions extending from a semiconductor substrate or insulator layer. Again, with reference to FIG. 5, pillar 352a includes first source/drain region 360a, body region 362a, and second source/drain region 364a. As indicated by the Figures, the body regions are lightly doped, e.g., p- semiconductor material, such that the pillar can provide a fully depleted transistor structure with channels formed along a side surface of the body region between the first and second source/drain regions.

The embodiments illustrated in FIGS. 6 through 11 also include this basic architecture for a programmable logic array: an array of monocrystalline semiconductor pillars separated by orthogonal trenches and each having at least three vertically aligned regions.

In each embodiment, the array of pillars can be "programmed" to implement a particular logic function by the selective formation of conductive lines in the trenches that separate adjacent rows of pillars. The conductive lines can be formed by chemical vapor deposition of, for example, metal or polysilicon as described in more detail below. Trenches separating rows of adjacent pillars can house one or two conductive lines. Further, these conductive lines can either form transistor gates or body contacts. In embodiments supporting body contacts, a particular conductive line can provide an input signal to transistors, e.g., a signal to a gate, in the programmable logic array while other conductive lines provide a body bias (fixed or synchronous with a conductive line in a trench on the opposite side of the pillar) for transistors of the array.

With conductive lines passing on each side of a pillar, gates can be formed on both sides of each pillar. Thus, by selectively forming the conductive lines, a single pillar can implement the function of either one transistor, two transistors or half of a transistor, e.g., one conductive line forms gates for pillars that are on opposite sides of the trench. The layout of the conductive lines of each embodiment is described in turn below.

Figure 4:
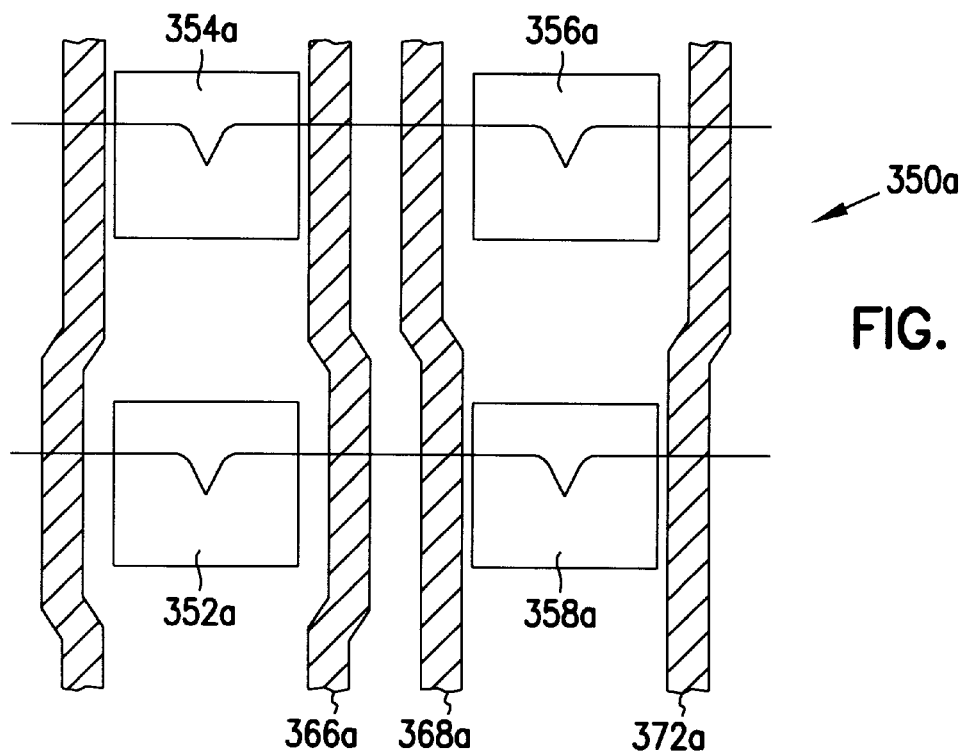
FIGS. 4 through 11 are top and front views that illustrate a number of embodiments of a logic plane according to the teachings of the present invention.
Figure 5:
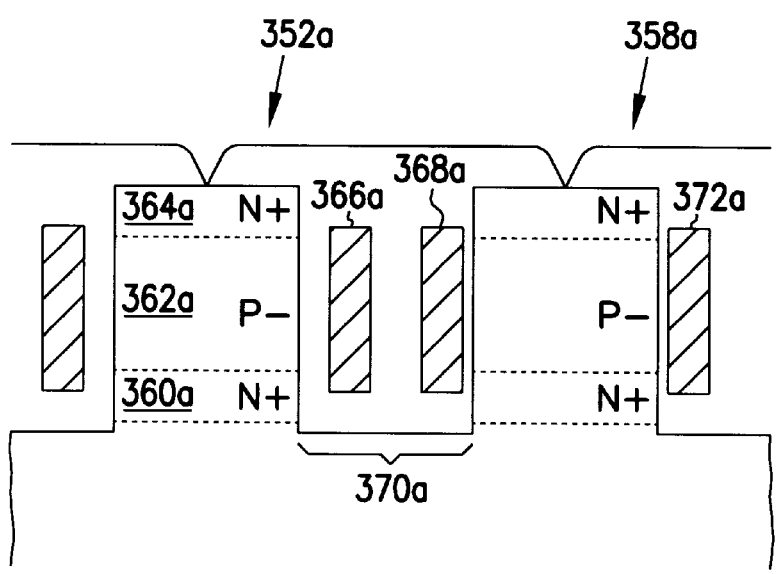

FIGS. 4 and 5 illustrate a "split gate" embodiment. In this embodiment, two conductive lines are formed in each trench that separates adjacent rows of pillars. For example, conductive lines 366a and 368a are formed in trench 370a. With this architecture, gates can be formed on two, opposite sides of a pillar. For example, conductive lines 368a and 372a form gates on opposite sides of pillar 358a. This allows pillar 358a to house two transistors; each with a channel region along one of the sides of pillar 358a. Alternatively, pillar 358a can implement a single transistor by coupling conductive lines 368a and 372a to the same input signal. When a pillar implements the functionality of two transistors, this provides the advantage of increasing the density of the array. However, when a pillar of this embodiment implements a single transistor this provides redundancy on the input signals provided to the transistor.

Figure 6:
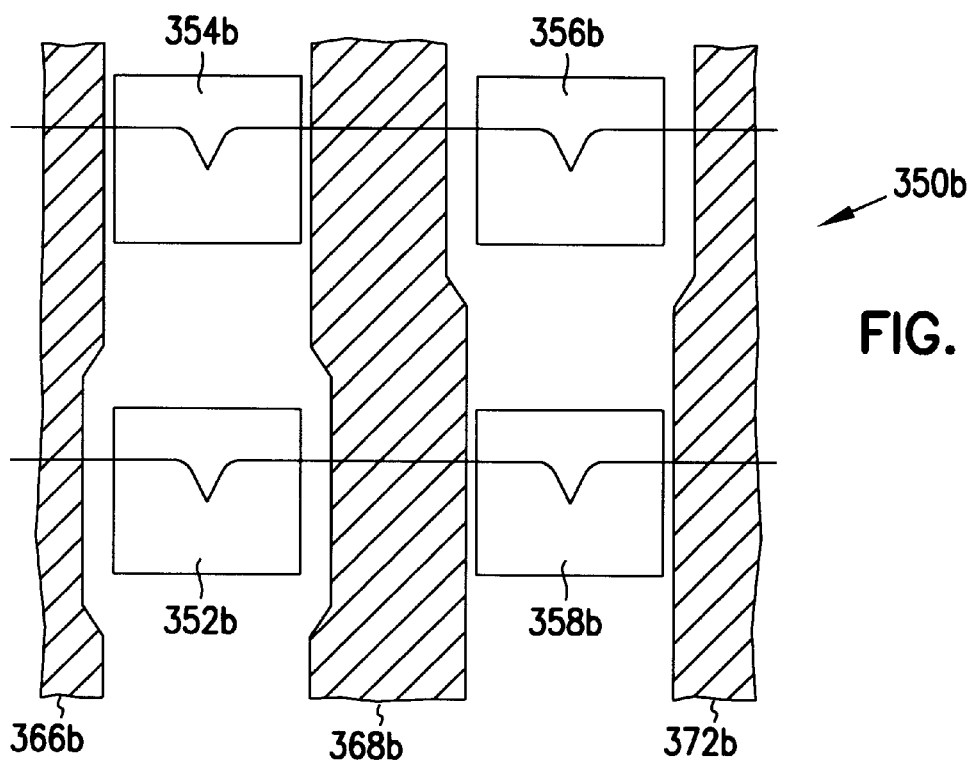
Figure 7:
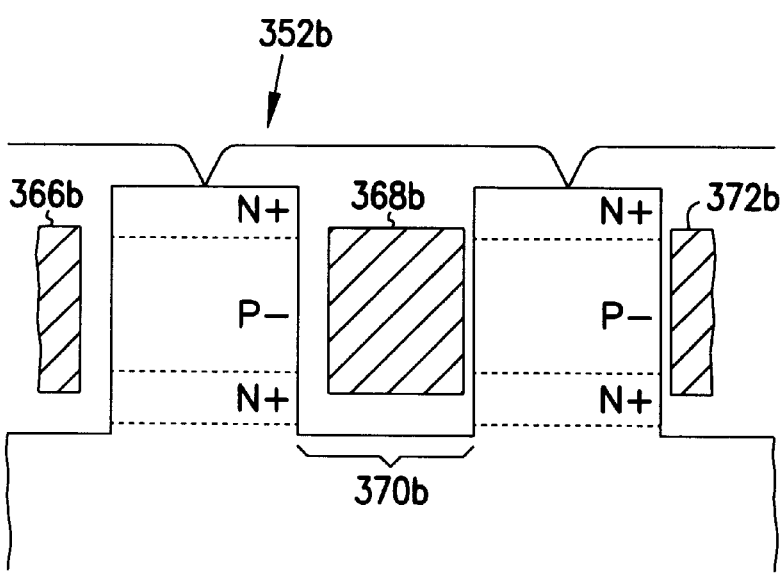

FIGS. 6 and 7 illustrate an embodiment of a logic plane 350b with a single conductive line formed between adjacent rows of pillars. The conductive lines in this embodiment form gates for selected pillars to implement a desired logic function for the logic plane. Conductive lines 366b and 368b form gates on either sides of pillar 354b.

Figure 8:
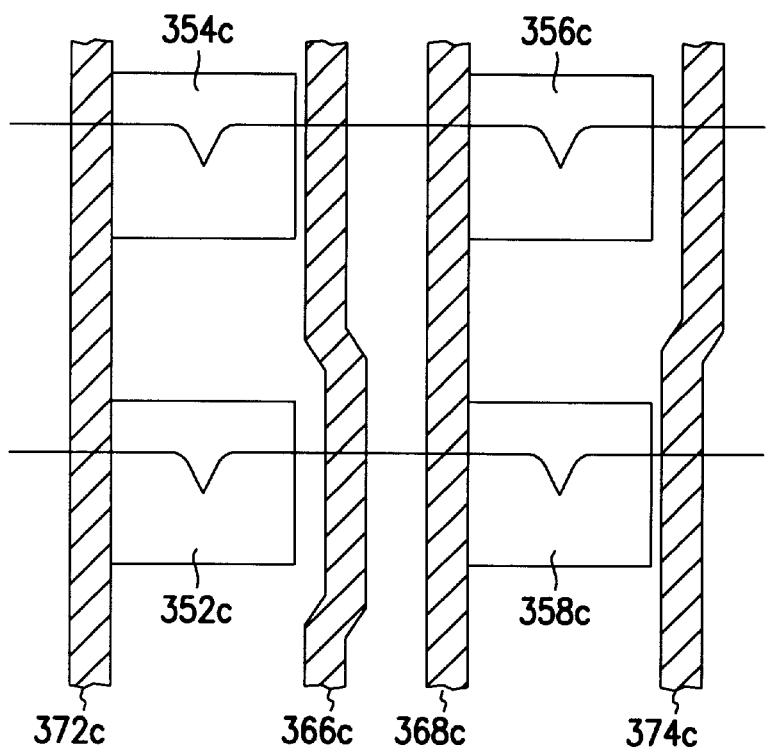
Figure 9:
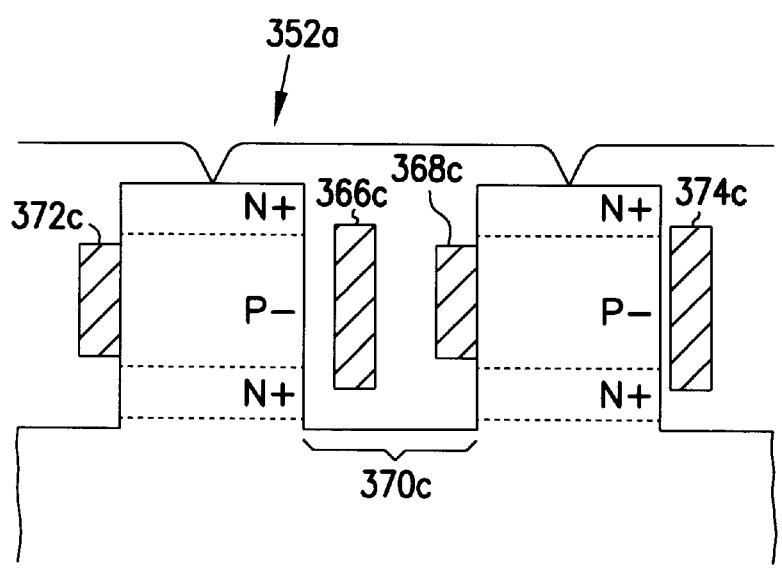

FIGS. 8 and 9 illustrate another embodiment of a logic plane 350c. In this logic plane, two conductive lines are formed in trenches that separate adjacent rows of pillars. Conductive lines 372c and 368c form body contacts for pillars 352c and 354c, and 356c and 358c, respectively. These conductive lines can provide a synchronous or fixed body bias. Conductive lines 366c and 374c are formed so as to provide gates for selected pillars of the logic plane. For example, conductive line 366c forms a gate for pillar 354c and conductive line 374c forms a gate for pillar 358c.

Figure 10:
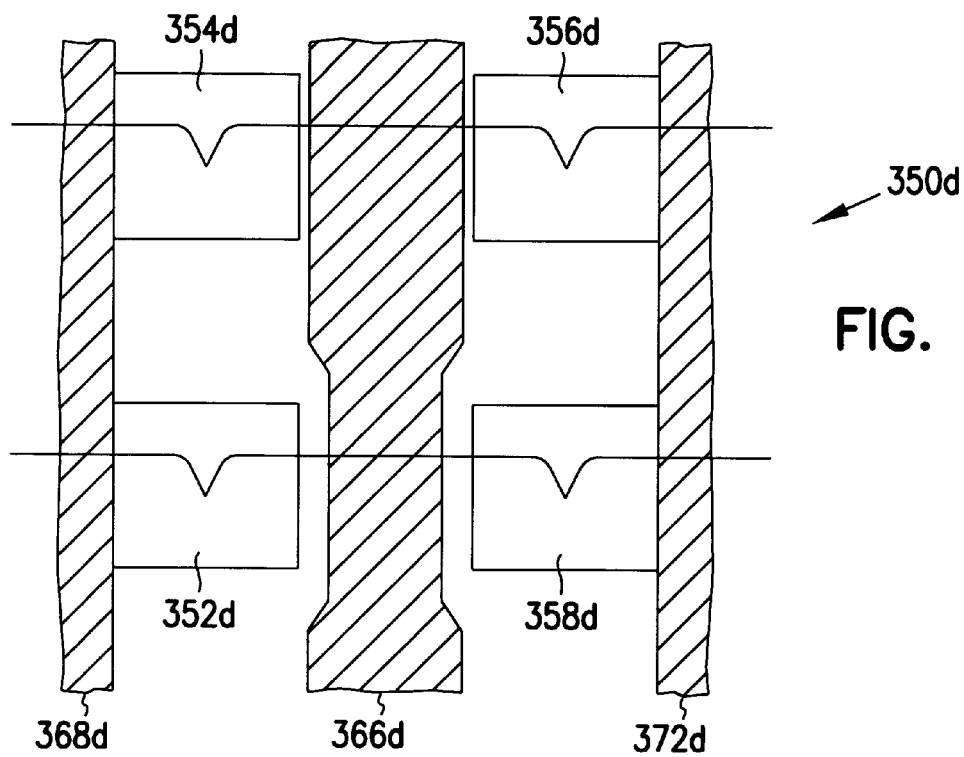
Figure 11:
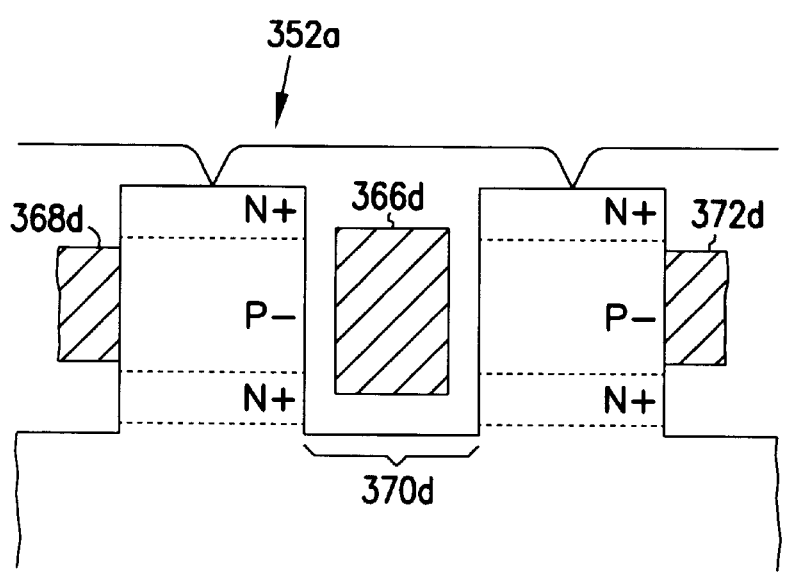

FIGS. 10 and 11 illustrate another embodiment of a logic plane 350d. In this logic plane, a single conductive line is formed in each trench that separates adjacent rows of pillars. Conductive lines 368d and 372d provide a body contact for pillars 352d and 354d, and 356d and 358d, respectively. Conductive line 366d selectively gates the pillars on either side of trench 370d so as to implement a desired logic function for logic plane 350d.

FIGS. 12, 13A, 13B, 14, 15, 16, 17, 18, 19, 20, and 21 illustrate generally one embodiment of a method of forming a logic plane for a programmable logic array according to the teachings of the present invention. In this embodiment, a portion of the logic plane, indicated generally at 400 is formed using bulk silicon processing techniques and is described, by way of example, with respect to a particular technology having a minimum lithographic "feature size," F, which is also sometimes referred to as a "critical dimension" (CD), of 0.4 microns. However, the process steps described below can be scaled accordingly for other minimum feature sizes without departing from the scope of the invention.

Figure 12:
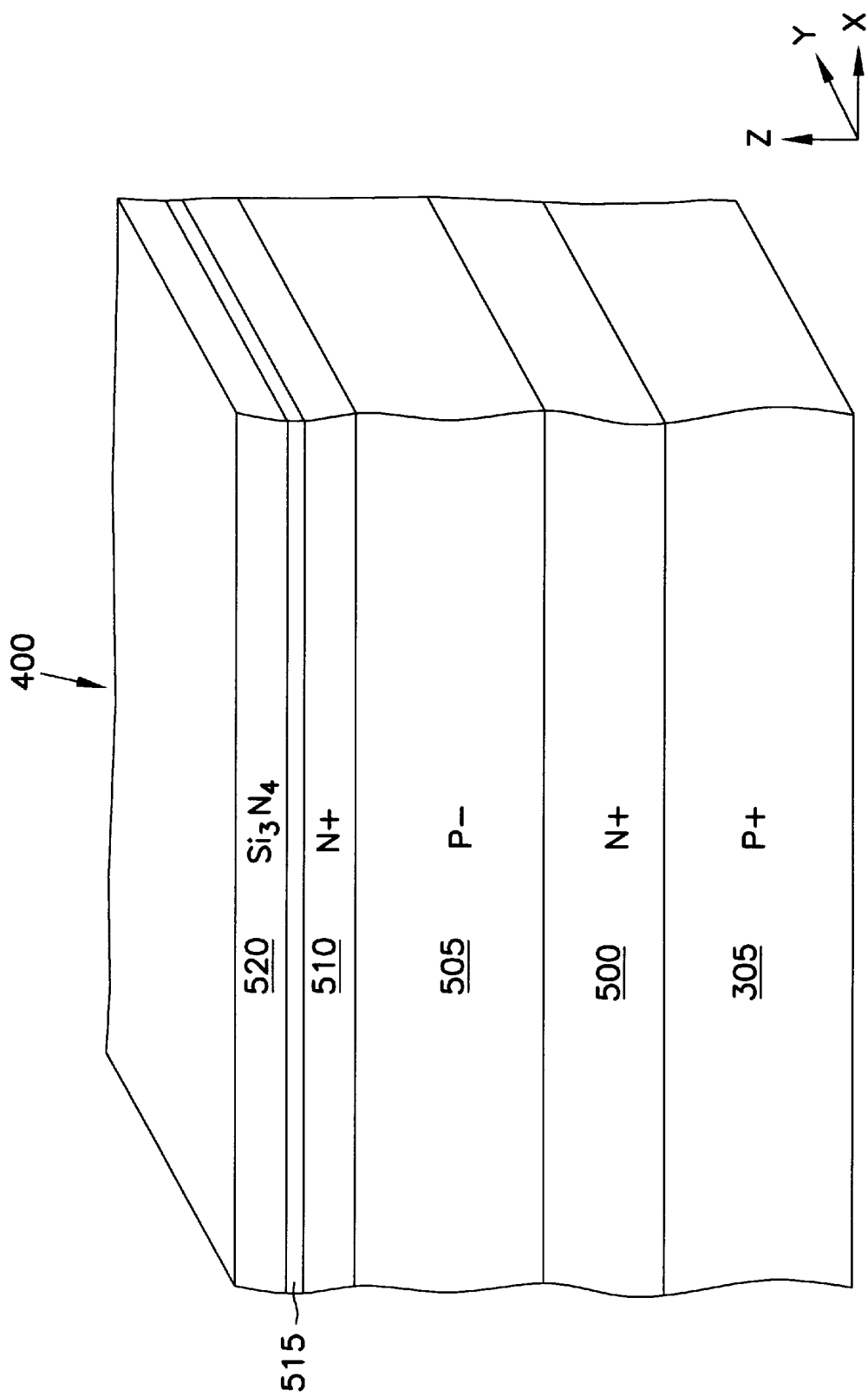
FIGS. 12, 13A, 13B, 14, 15, 16, 17, 18, 19, 20, and 21 illustrate generally various stages of one embodiment of a method of forming an array of logic cells according to the teachings of the invention.

In FIG. 12, a P+ silicon starting material is used for substrate 305. A first source/drain layer 500, of approximate thickness of 0.2 microns, is formed at a working surface of substrate 305. In one embodiment, first source/drain layer 500 is N+ silicon formed by ion-implantation of donor dopants into substrate 305. In another embodiment, first source/drain layer 500 is N+ silicon formed by epitaxial growth of silicon upon substrate 305. On the first source/drain layer 500, a semiconductor epitaxial layer 505, such as P- silicon of 0.4 micron approximate thickness, is formed, such as by epitaxial growth. Layer 505 is referred to as body layer 505.

A second source/drain layer 510, such as N+ silicon of 0.1 to 0.2 microns approximate thickness, is formed at a surface of the epitaxial layer 505, such as by ion-implantation of donor dopants into P– epitaxial layer 505 or by epitaxial growth of N+ silicon on P– epitaxial layer 505. A thin layer of silicon dioxide (SiO$_2$), referred to as pad oxide 515, is deposited on the second source/drain layer 510. Pad oxide 515 has a thickness of approximately 10 nanometers. A layer of silicon nitride (Si$_3$N$_4$), referred to as pad nitride 520, is deposited on pad oxide 515. Pad nitride 520 has a thickness of approximately 100 nanometers.

Figure 13A:
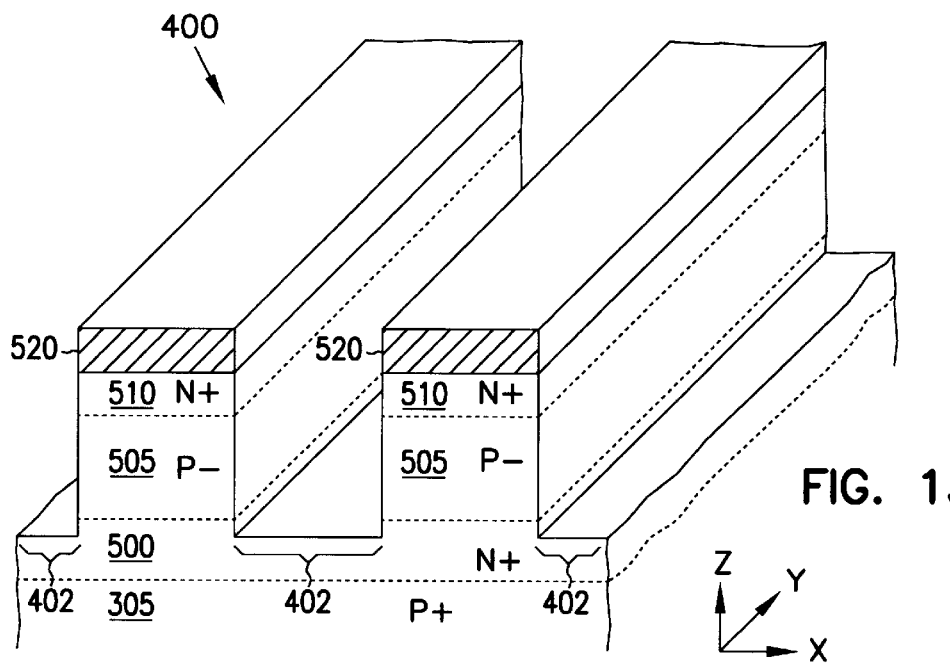
Figure 13B:
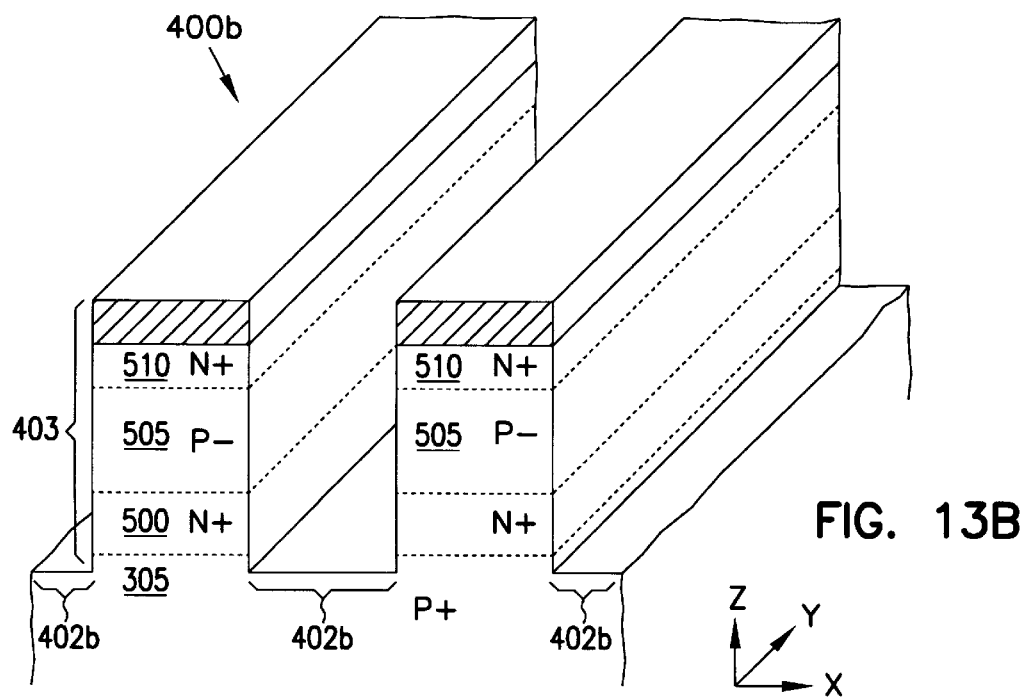

A photoresist layer is deposited outwardly from pad nitride 520. The photoresist layer is exposed through a mask to define parallel minimum dimension stripes in the Y-direction. In the embodiment of FIG. 13A, trenches 402 are formed through the stripe pattern in the photoresist layer. Trenches 402 extend through pad nitride 520, second source/drain layer 510, body layer 505 and into first source/drain layer 500. In this case, first source/drain layer 500 is maintained at ground potential to act as a ground plane for logic plane 400. In the embodiment of FIG. 13B, trenches 402b extend through pad nitride 520, second source/drain layer 510, body layer 505, first source/drain layer 500 and into substrate 305. In this embodiment, the ground plane is divided into a number of separate ground lines for the logic plane.

The remaining steps are described in terms of the embodiment of FIG. 13A although similar steps can be applied to complete the embodiment of FIG. 13B. The photoresist is removed by conventional photoresist stripping techniques.

Figure 14:
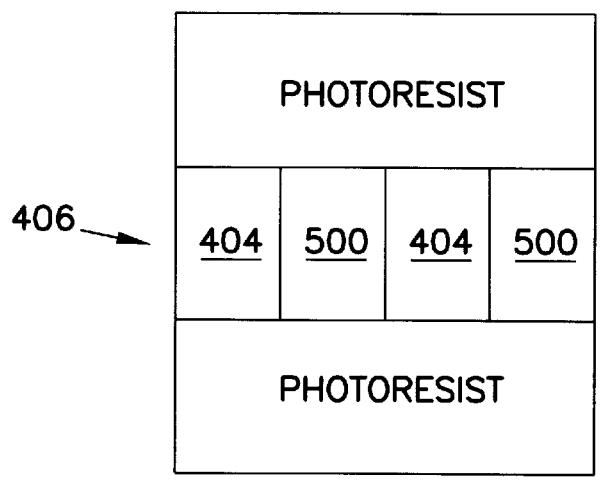

Next, a second set of trenches is formed so as to create an array of semiconductor pillars. Existing trenches 402 are filled with an insulator by, for example, chemical vapor deposition of oxide layer 404. Oxide layer 404 is planarized with nitride pad 520 such as by chemical mechanical polishing (CMP) or other suitable planarization technique. Another photoresist layer is deposited and masked to define a second set of minimum dimension stripes that are orthogonal to trenches 402, i.e., in the X-direction. A nitride etchant is used to etch through pad 520. Next, a selective silicon etchant is used to etch exposed silicon to a depth approximately equal to trenches 402. A top view of this portion of decoder 400 is shown in FIG. 14.

Figure 15:
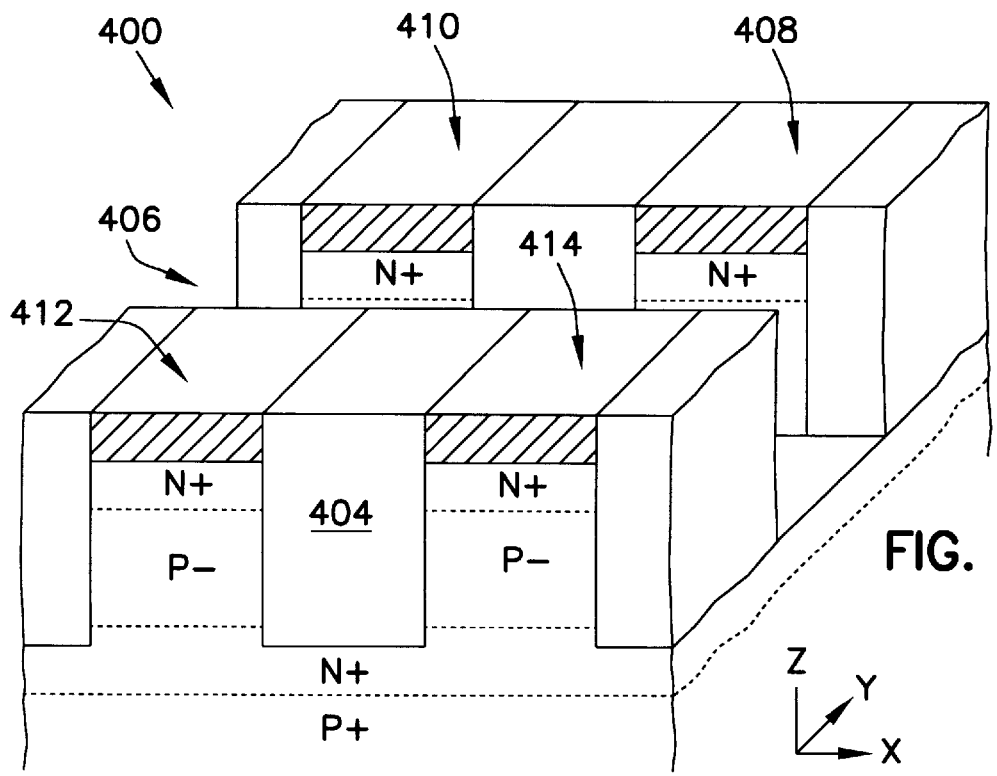

With the photoresist layer still in place, exposed portions of oxide layer 404 are removed stopping on the silicon material at the bottom of trenches 402. The photoresist layer is then removed by conventional photoresist stripping techniques. This leaves the structure as shown in FIG. 15 with trenches 406 separating rows of semiconductor pillars. FIG. 15 explicitly shows pillars 408, 410, 412 and 414. However, it is understood that logic plane 400 includes a large number of pillars that are formed in a number of rows and columns defined by trenches 402 and 406.

Next, conductive lines and gates are selectively formed in trenches 406. The gates are formed adjacent to selected pillars such that logic plane 400 implements a desired function. Nitride (Si$_3$N$_4$) is deposited by, for example, chemical vapor deposition with a thickness on the order of 10 nanometers. The nitride layer is directionally etched to leave on vertical walls only of trench 406. Thermal oxide layer 416 is grown on the bottom of trenches 406 to a thickness of approximately 100 nanometers and the nitride layer is stripped from the vertical sidewalls.

Figure 16:
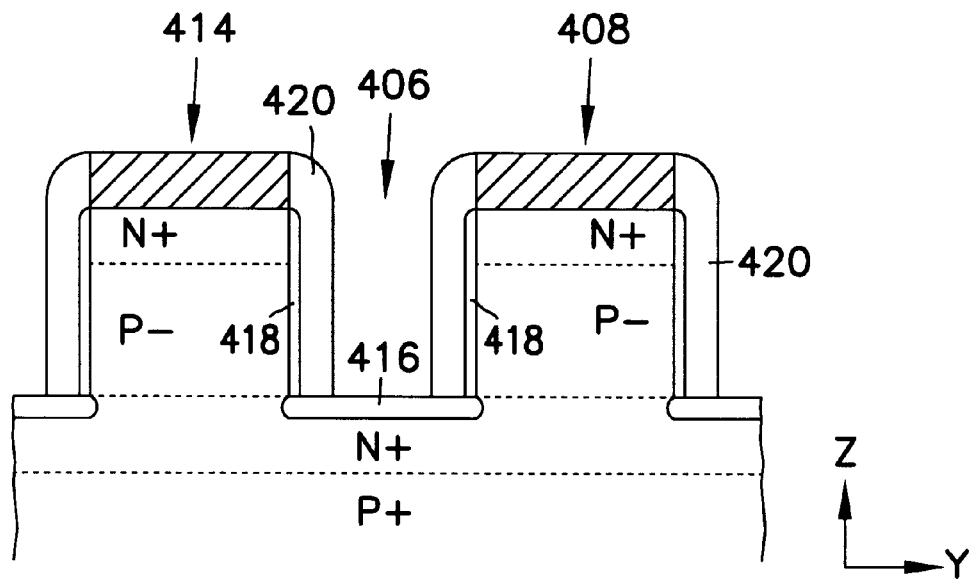

Protective oxide layer 418 is formed, for example, by growing a thin thermal oxide layer of approximately 10 nanometers on the side walls of trenches 406. Intrinsic polysilicon layer 420 is deposited by, for example, chemical vapor deposition with a thickness of approximately 50 nanometers. Layer 420 is etched by, for example, reactive ion etching (RIE) techniques to leave layer 420 on vertical sidewalls only. This structure is shown in FIG. 16.

Next, logic plane 400 is mask programmed by selectively removing portions of polysilicon layer 420 adjacent to pillars where a transistor is needed to implement a desired logic function. A gate is then formed adjacent to these pillars. As for the remaining pillars, polysilicon layer 420 acts as a spacer that prevents an address line or inverse address line from being formed sufficiently close to the pillar so as to form a gate of a transistor.

Figure 17:
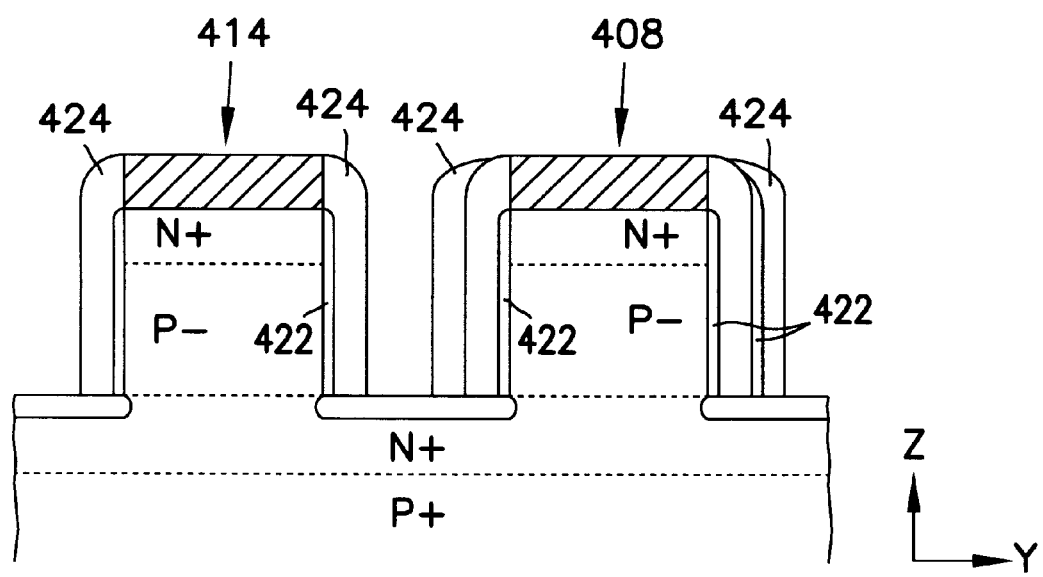

A photoresist layer is applied and selectively exposed through a mask to uncover the sidewalls, and adjacent layer 420, of selected pillars to implement the desired logical function. The exposed portions of layer 420 are etched from the vertical sidewalls in trenches 406. The resist is removed and gate insulator 422, e.g., silicon dioxide, is grown or deposited on the exposed vertical sidewalls. N+ polysilicon is deposited by chemical vapor deposition with a thickness of approximately 50 nanometers. The polysilicon layer is directionally etched to leave layer 424 on vertical surfaces only and to expose the tops of layer 420 as shown in FIG. 17.

At this point, the process can take one of two paths depending on whether the embodiment incorporates body contacts. If no body contacts are included, all remaining nitride is selectively stripped. Techniques known in the art are used to remove the remaining portions of layer 420 selectively to doped silicon. Oxide is deposited by chemical vapor deposition to fill the recesses in logic plane 400 and to cover the semiconductor pillars. Contacts and wiring are formed using conventional processing techniques to connect columns of pillars.

In the described embodiment, split address lines are shown. It is understood that once the gate oxide is in place, the trench can be filled with N+ polysilicon to create a single address line between the rows of pillars in a non-split address line embodiment.

If body contacts are included in the embodiment, the process proceeds with the formation of these contacts as shown in FIGS. 18 through 21.

Figure 18:
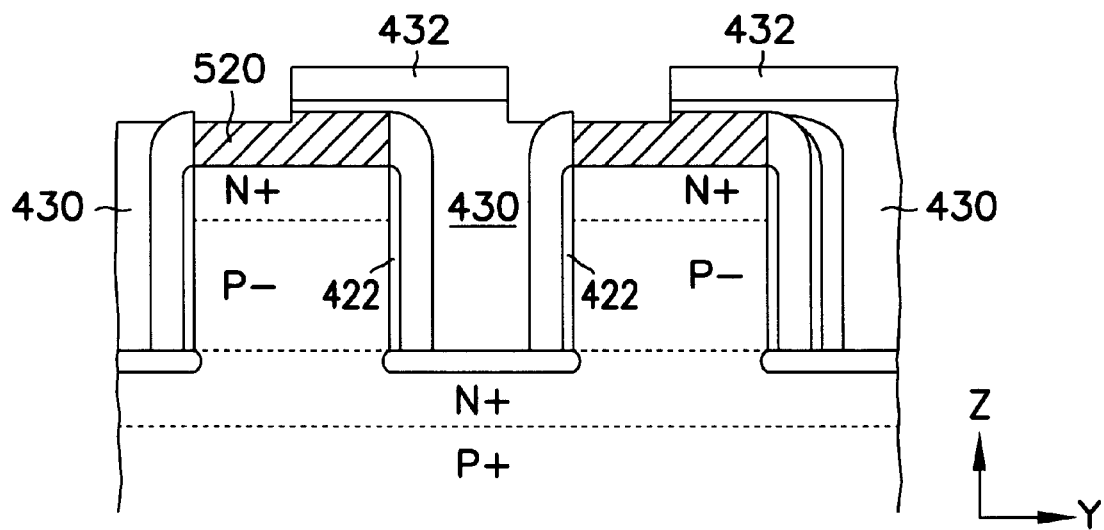

Nitride layer 430 is deposited using, for example, chemical vapor deposition to a level approximately 20 nanometers above nitride pads 520. Photoresist layer 432 is deposited and exposed through a mask to form a stripe pattern in the X-direction. Nitride layer 430 is etched briefly to expose alternate polysilicon layers 424 located in the openings of photoresist layer 432 as shown in FIG. 18.

Figure 19:
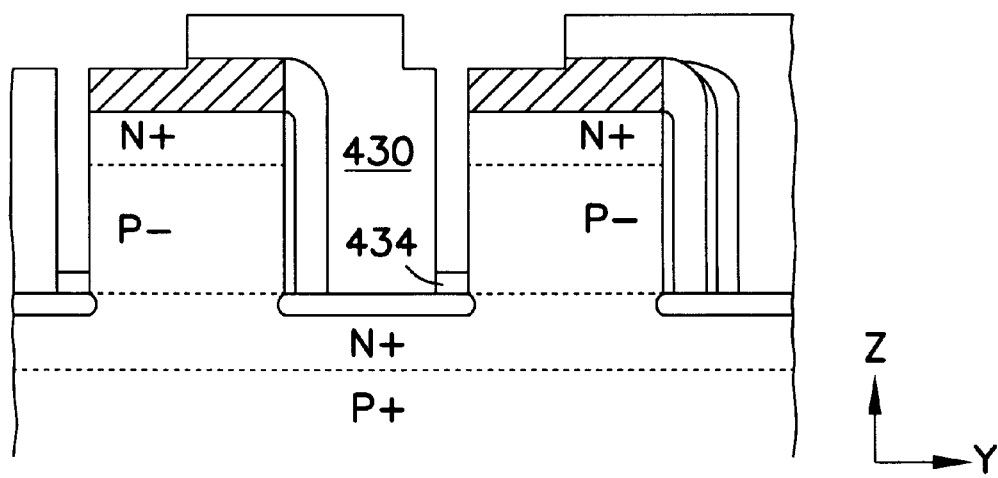

Exposed polysilicon layers 424 are removed using an etching technique and photoresist layer 432 is removed. An oxide material is deposited in the space vacated by the polysilicon. The oxide material is planarized to the level of nitride layer 430. The oxide material is directionally etched with a reactive ion etch sufficiently to expose P– layer 505 of the pillars leaving oxide layer 434 at the bottom of trenches 406 as shown in FIG. 19.

Figure 20:
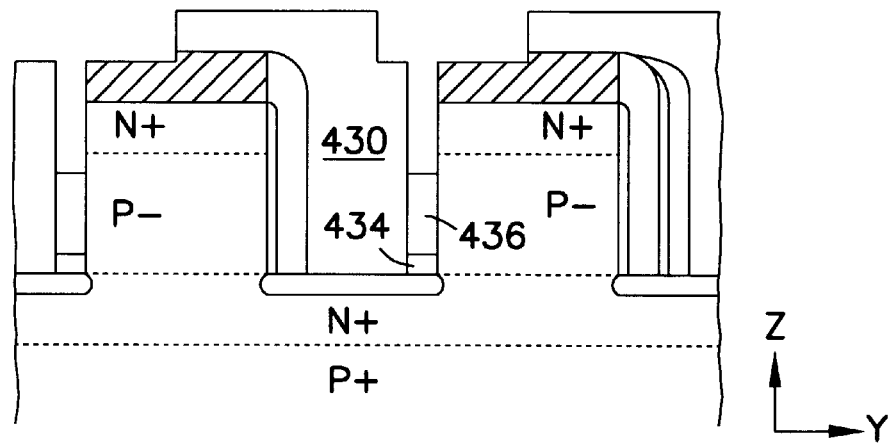
Figure 21:
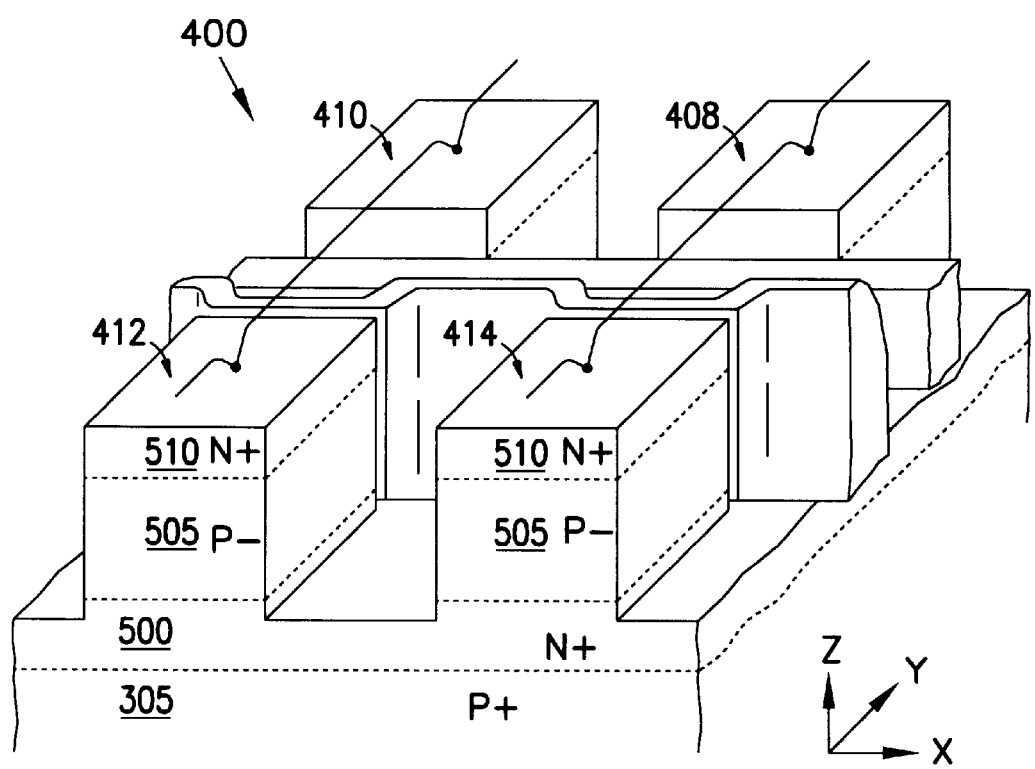

P+ polysilicon 436 is deposited on layer 434 using chemical vapor deposition and planarized with nitride layer 430. The P+ polysilicon is etched back to below the junction of layers 510 and 505 to form body contacts as shown in FIGS. 20 and 21.

CONCLUSION

Embodiments of the present invention provide a programmable logic array with an increased density with respect to conventional arrays. Specifically, vertical transistors are used with conductive lines formed in trenches that separate adjacent rows of semiconductor pillars. The vertical transistors are selectively coupled by mask programming to form these lines so as to implement a desired logical function. It is to be understood that the above description is intended to be illustrative, and not restrictive. Many other embodiments will be apparent to those of skill in the art upon reviewing the above description. For example, the logical function implemented by the programmable logic array can be varied without departing from the scope of the present invention. Further, the size of the array, the number of inputs, the number of interconnects, and the number of outputs can similarly be varied.

What is claimed is:

1. A programmable logic array, comprising:
   a first logic plane that receives a number of input signals, the first logic plane having a plurality of vertical transistors, each having a first source/drain region, a body region and a second source/drain region, wherein the vertical transistors include one gate that is formed in a trench adjacent to the body region and have a body contact that is formed adjacent to the body region on a side opposite the gate, wherein the body contact is pulsed in synchronization with the gate, and wherein the vertical transistors are arranged in rows and columns that are interconnected to provide a number of logical outputs; and
   a second logic plane having a number of vertical transistors arranged in rows and columns that receive the outputs of the first logic plane and that are interconnected to produce a number of logical outputs such that the programmable logic array implements a logical function.

2. The programmable logic array of claim 1, wherein the first logic plane and the second logic plane each comprise NOR planes.

3. The programmable logic array of claim 1, wherein the vertical transistors each comprise a first source/drain region, a body region and a second source/drain region that are vertically aligned in a monocrystalline semiconductor pillar and that extend outwardly from a semiconductor substrate.

4. The programmable logic array of claim 3, wherein the vertical transistors in the second logic plane include one gate that is formed in a trench adjacent to the body region.

5. The programmable logic array of claim 3, wherein the vertical transistors in the second logic plane include one gate that is formed in a trench adjacent to the body region and a body contact that is formed adjacent to the body region on a side opposite the gate.

6. The programmable logic array of claim 3, wherein the vertical transistors include first and second gates that are formed in trenches adjacent to the body region on opposite sides of the pillar.

7. The programmable logic array of claim 3, wherein the trench separates adjacent rows of pillars and the trench houses one input line that is coupled to gates of selected transistors on either side of the trench.

8. The programmable logic array of claim 3, wherein the trench separates adjacent rows of pillars and the trench houses two input lines that are each coupled to gates of selected transistors on one side of the trench.

9. The programmable logic array of claim 3, wherein the trench separates adjacent rows of pillars and the trench houses an input line that is coupled to gates of selected transistors on one side of the trench and a body contact line that is coupled to the body region of each pillar on the other side of the trench.

10. The programmable logic array of claim 1, wherein the substrate is a bulk semiconductor.

11. The programmable logic array of claim 1, wherein the working surface of the substrate includes an insulating layer formed on top of an underlying semiconductor.

12. The programmable logic array of claim 1, wherein the programmable logic array is operatively coupled to a computer system.

13. The programmable logic array of claim 5, wherein the body contact is maintained at a substantially constant voltage.

14. The programmable logic array of claim 5, wherein the body contact in the second logic plane is pulsed in synchronization with the gate.

15. The programmable logic array of claim 3, wherein the body region comprises a lightly doped body region such that the transistor functions as a fully depleted transistor.

16. The programmable logic array of claim 3, wherein the first source/drain regions of the pillars of the array are coupled together.

17. A computer system, comprising:
    at least one input/output device;
    a memory; and
    a central processing unit, the central processing unit coupled to the memory and the at least one input/output device, the central processing unit including at least one programmable logic array including:
      a first logic plane that receives a number of input signals, the first logic plane having a plurality of vertical transistors, each having a first source/drain region, a body region and a second source/drain region, wherein the vertical transistors include one gate that is formed in a trench adjacent to the body region and have a body contact that is formed adjacent to the body region on a side opposite the gate, wherein the body contact is pulsed in synchronization with the gate, and wherein the vertical transistors are arranged in rows and columns that are interconnected to provide a number of logical outputs; and
      a second logic plane having a number of vertical transistors arranged in rows and columns that receive the outputs of the first logic plane and that are interconnected to produce a number of logical outputs such that the programmable logic array implements a logical function for the central processing unit.

18. The computer system of claim 17, wherein the first logic plane and the second logic plane each comprise NOR planes.

19. The computer system of claim 17, wherein the vertical transistors in the second logic plane each comprise a first source/drain region, a body region and a second source/drain region that are vertically aligned in a monocrystalline semiconductor pillar and that extend outwardly from a semiconductor substrate.

20. The computer system of claim 19, wherein the vertical transistors in the second logic plane include one gate that is formed in a trench adjacent to the body region.

21. The computer system of claim 19, wherein the vertical transistors in the second logic plane include one gate that is formed in a trench adjacent to the body region and a body contact that is formed adjacent to the body region on a side opposite the gate.

22. The computer system of claim 19, wherein the vertical transistors include first and second gates that are formed in trenches adjacent to the body region on opposite sides of the pillar.

23. The computer system of claim 19, wherein the trench separates adjacent rows of pillars and the trench houses one input line that is coupled to gates of selected transistors on either side of the trench.

24. The computer system of claim 19, wherein the trench separates adjacent rows of pillars and the trench houses two input lines that are each coupled to gates of selected transistors on one side of the trench.

25. The computer system of claim 19, wherein the trench separates adjacent rows of pillars and the trench houses an input line that is coupled to gates of selected transistors on one side of the trench and a body contact line that is coupled to the body region of each pillar on the other side of the trench.

26. The computer system of claim 17, wherein the substrate is a bulk semiconductor.

27. The computer system of claim 17, wherein the working surface of the substrate includes an insulating layer formed on top of an underlying semiconductor.

28. The computer system of claim 21, wherein the body contact is maintained at a substantially constant voltage.

29. The computer system of claim 19, wherein the body region comprises a lightly doped body region such that the transistor functions as a fully depleted transistor.

30. The computer system of claim 19, wherein the first source/drain regions of the pillars of the array are coupled together.

* * * * *

UNITED STATES PATENT AND TRADEMARK OFFICE
CERTIFICATE OF CORRECTION

PATENT NO. : 6,208,164 B1
DATED : March 27, 2001
INVENTOR(S) : Noble et al.

It is certified that error appears in the above-identified patent and that said Letters Patent is hereby corrected as shown below:

Column 2,
Line 14, delete "thee" and insert -- the --, therefor.

Signed and Sealed this

Eighteenth Day of December, 2001

Attest:

JAMES E. ROGAN
Attesting Officer    Director of the United States Patent and Trademark Office